United States Patent
Seth et al.

(10) Patent No.: US 9,083,317 B2
(45) Date of Patent: Jul. 14, 2015

(54) METHOD FOR SENSING AND CALIBRATING ANTENNA TUNER DEVICE PERFORMANCE IN CELLULAR HANDSET

(71) Applicant: wiSpry, Inc., Irvine, CA (US)

(72) Inventors: Maarten A. E. Seth, Dana Point, CA (US); Kerrance Lynn Carpenter, Wake Forest, NC (US)

(73) Assignee: WISPRY, INC., Irvine, CA (US)

( * ) Notice: Subject to any disclaimer, the term of this patent is extended or adjusted under 35 U.S.C. 154(b) by 217 days.

(21) Appl. No.: 13/867,786

(22) Filed: Apr. 22, 2013

(65) Prior Publication Data
US 2013/0309980 A1    Nov. 21, 2013

Related U.S. Application Data

(60) Provisional application No. 61/636,350, filed on Apr. 20, 2012.

(51) Int. Cl.
| | |
|---|---|
| *H04B 1/00* | (2006.01) |
| *H03J 5/00* | (2006.01) |
| *H04B 17/12* | (2015.01) |
| *H04B 17/10* | (2015.01) |

(52) U.S. Cl.
CPC . *H03J 5/00* (2013.01); *H04B 17/12* (2015.01); *H04B 17/102* (2015.01)

(58) Field of Classification Search
CPC .......... H03J 5/00; H04B 17/102; H04B 17/12
USPC .......................................................... 455/77
See application file for complete search history.

(56) References Cited

U.S. PATENT DOCUMENTS

| | | | |
|---|---|---|---|
| 2006/0183443 A1* | 8/2006 | Chang et al. ................. | 455/121 |
| 2007/0232367 A1* | 10/2007 | Kasha et al. ................. | 455/574 |
| 2008/0158076 A1 | 7/2008 | Walley | |
| 2008/0181328 A1 | 7/2008 | Harel et al. | |
| 2010/0164561 A1 | 7/2010 | Roberg et al. | |
| 2011/0243007 A1 | 10/2011 | Xiao | |
| 2013/0052967 A1* | 2/2013 | Black et al. ..................... | 455/77 |

FOREIGN PATENT DOCUMENTS

| | | |
|---|---|---|
| KR | 10-2010-0071226 | 6/2010 |
| WO | WO 2013/159100 | 10/2013 |

OTHER PUBLICATIONS

International Search Report for Application No. PCT/US2013/037612 dated Jul. 26, 2013.

* cited by examiner

*Primary Examiner* — David Bilodeau
(74) *Attorney, Agent, or Firm* — Jenkins, Wilson, Taylor & Hunt, P.A.

(57) ABSTRACT

Systems and methods for calibrating antenna tuner device parameters can involve measuring a first signal level of an antenna tuner device, adjusting a tuning setting of the antenna tuner device, measuring one or more adjusted signal levels of the antenna tuner device, determining a level change between the first signal level and the one or more adjusted signal levels, comparing the level change to a predefined reference level change, and adjusting a device setting of the antenna tuner device to compensate for a difference between the level change and the predefined reference level change.

20 Claims, 3 Drawing Sheets

METHOD FOR SENSING AND CALIBRATING ANTENNA TUNER DEVICE PERFORMANCE IN CELLULAR HANDSET

PRIORITY CLAIM

The present application claims the benefit of U.S. Provisional Patent Application Ser. No. 61/636,350, filed Apr. 20, 2012, the disclosure of which is incorporated herein by reference in its entirety.

TECHNICAL FIELD

The subject matter disclosed herein relates generally to the configuration and operation of tunable impedance matching networks. More particularly, the subject matter disclosed herein relates to systems and methods for configuring an antenna tuner to have predictable performance parameters.

BACKGROUND

Matching networks that utilize tunable components can be used in cellular telephone handsets, specifically in handset antenna applications, for matching variable loads and/or optimizing performance at multiple frequencies. Antenna tuner performance can be highly dependent, however, on finding the optimum settings of the individual tunable components in the matching network. Deviations from the optimum values for one or more components can lead to less than desired total radiated power (TRP) and/or total isotropic sensitivity (TIS) performance in the application.

Once source of such deviation from optimum values can be that varying performance of tunable capacitors (i.e., AC) between foundries, lots, and wafers can result in part-to-part variation, which can typically be around 10% or more. Such manufacturing variances are inherent to the process in which the capacitors are manufactured, but they can lead to unwanted variations in capacitance (and hence TRP/TIS) between devices, even when programmed with identical tuning words. Furthermore, open loop antenna tuner applications generally require fairly accurate capacitor performance (e.g., within about 5%), making the manufacturing variances even more problematic.

One option to address this variation is to maintain strict tolerances on the production of these devices, allowing only those that meet particular performance parameters to be used in the antenna tuner. Testing in this way to sort for tight tolerance parts, however, can result in poor yield, which can dramatically drive up the production costs for such devices. Alternatively, device manufacturers can compensate for poor component performance by non-volatile memory to calibrate the performance of a component die. Such memory-based corrections are typically added on before total system integration, and thus deviations from optimal performance can still occur as a result of other factors (e.g., inductor tolerances, variances in component mounting).

As a result, it would be desirable for systems and methods for manufacturing and/or configuring tunable matching network components that combine good yield with good open loop application performance.

SUMMARY

In accordance with this disclosure, systems and methods for configuring an antenna tuner to have predictable performance parameters are provided. In one aspect, a method for calibrating antenna tuner device parameters is provided. The method can comprise measuring a first signal level of an antenna tuner device, adjusting a tuning setting of the antenna tuner device, measuring one or more adjusted signal levels of the antenna tuner device, determining a level change between the first signal level and the one or more adjusted signal levels, comparing the level change to a predefined reference level change, and adjusting a device setting of the antenna tuner device to compensate for a difference between the level change and the predefined reference level change.

In another aspect, a method for calibrating antenna tuner device parameters can comprise measuring a first received signal level for an antenna tuner device set to a first tuning state, adjusting a setting of one or more tunable inductors of the antenna tuner device, measuring a second received signal level when the antenna tuner device is set to a second tuning state, determining a level change between the first received signal level and the second received signal level, comparing the level change to a predefined reference level change, and adjusting a setting of one or more tunable capacitors of the antenna tuner device to compensate for a difference between the level change and the predefined reference level change.

In yet another aspect, a system for calibrating antenna tuner device parameters is provided. The system can comprise an antenna, a tunable filter connected to the antenna, and a controller connected to the tunable filter. The controller can be configured to measure a first signal level transmitted or received by the antenna, adjust a tuning setting of the tunable filter, measure one or more adjusted signal levels transmitted or received by the antenna, determine a level change between the first signal level and the one or more adjusted signal levels, compare the level change to a predefined reference level change, and adjust a device setting of the tunable filter to compensate for a difference between the level change and the predefined reference level change.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides systems and methods for configuring an antenna tuner to have predictable performance parameters. Specifically, systems and methods for calibrating the performance of such components as installed in a device can address the typical variability of tunable components of a matching network without sacrificing manufacturing yield and while still providing improved open loop application performance.

In particular, by using performance parameters available in the baseband and measuring the change in those parameters as the settings of the matching network are adjusted, and comparing the change in parameter value to known responses, a level of performance for a particular antenna tuner when mounted in the system can be accurately determined. With this information, the tunability of the capacitor bank can be used to compensate for device performance (e.g., determine an effective tuning increment/sensitivity), hence obtaining a more predictably tunable and/or optimum setting for each and every phone/system. Furthermore, by analyzing the performance of the antenna system when it is mounted in a device, the tuning settings can account for whole-system performance variation rather than each component individually. In this way, the problems of low yield due to non-centered distribution of device performance and variance in phone performance due to antenna tuner variation as well as the variation in the antenna and circuitry surrounding the tuner can be addressed.

Figure 1A:
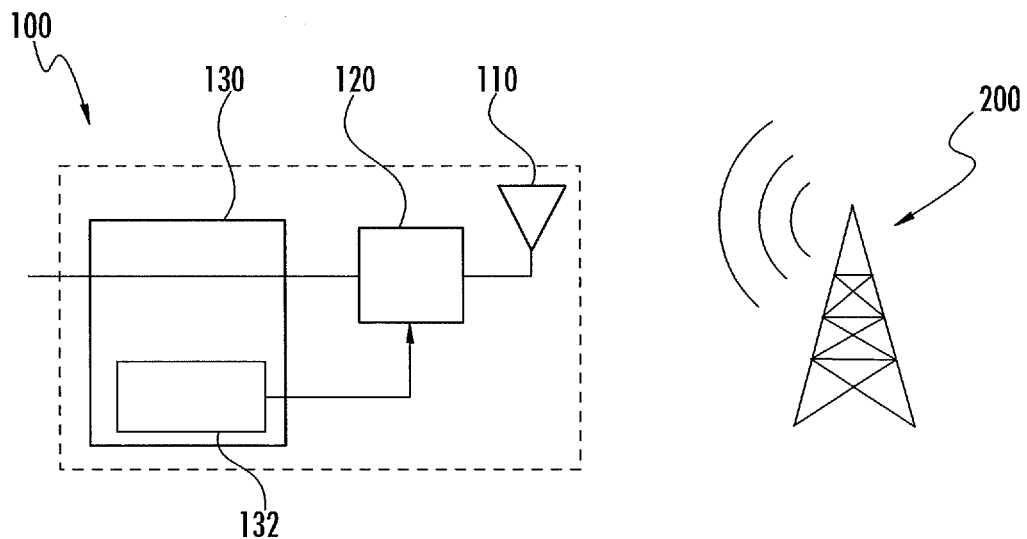
FIGS. 1A and 1B are schematic views of a tunable antenna system according to an embodiment of the presently disclosed subject matter.
Figure 1B:
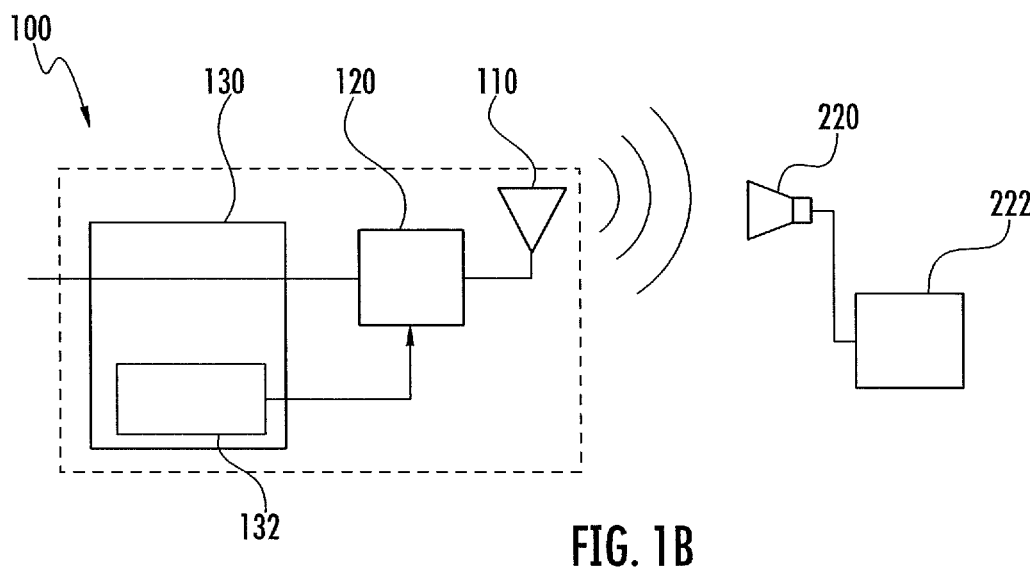

In one aspect, the present subject matter provides a configuration for a tunable antenna system that can be calibrated after assembly. As shown in FIGS. 1A and 1B, for example, a tunable antenna system, generally designated 100, can include an antenna 110. Tunable antenna system 100 can further include a tunable filter 120, which can comprise one or more tunable capacitors and/or inductors, tunable filter 120 being connected to antenna 110. Specifically, for example, tunable filter 120 can comprise a tunable matching network. In this regard, tunable elements can be provided as a part of the antenna tuning, but such elements can further serve as part of an in-line filtering system with in-line impedance tuning.

Those having skill in the art will recognize that although only one each of antenna 110 and the tunable filter 120 are shown and described herein, two or more of antenna 110 can be included in antenna system 100. Specifically, for example, two antennas can be provided, one connected in communication with a receive terminal (Rx) and configured for operation over a first operating frequency band, and the other in communication with a transmit terminal (Tx) and configured for operation over a second operating frequency band. Further in this regard, although only a single tunable filter 120 is shown, multiples of tunable filter 120 can be provided in antenna system 100. Referring again to a multi-band configuration configured for transmitting and receiving information on separate frequency bands, a tunable filter 120 can be provided in communication with each antenna 110 to separately adjust the tuning state of the respective signal line.

Regardless of the particular configuration, the operation of tunable filter 120 can allow antenna 110 to be tuned to address multiple frequency bands and/or to adjust frequency spacing between elements of the system (e.g., between a Rx signal path and a Tx signal path). To control this tuning, a processor 130 (e.g., a communications processor or applications processor) can be connected to tunable filter 120. Processor 130 can provide signal processing functionality commonly provided in wireless devices, and processor 130 can further comprise a tuning controller 132 in communication with tunable filter 120 and configured to adjust the tuning setting of tunable filter 120.

Figure 2:
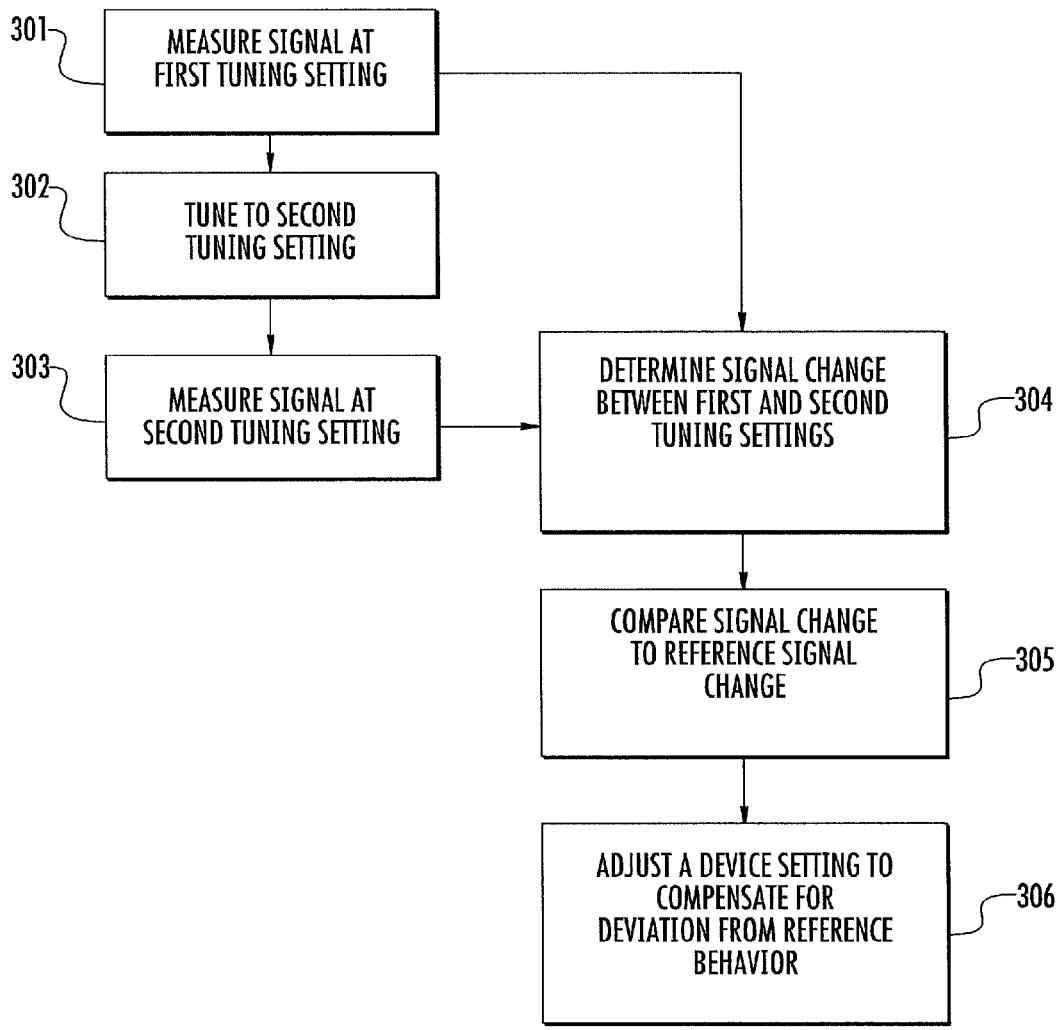
FIG. 2 is a process flow chart illustrating steps in a method for calibrating antenna tuner device parameters according to an embodiment of the presently disclosed subject matter.

In this regard, in another aspect, the present subject matter provides a method for calibrating antenna tuner device parameters within a tunable antenna system (e.g., an embodiment of antenna system 100 disclosed hereinabove). In particular, for example, such a method can comprise the steps shown in the flow chart illustrated in FIG. 2. In such a method, a first signal level of antenna system 100 can be measured at a first tuning setting in a first measuring step 301. This first tuning setting can be a baseline setting corresponding to the default setting or untuned state of the tunable filter 120.

Tunable filter 120 can then be adjusted in a tuning step 302 to change to a second tuning setting of antenna system 100. For instance, adjusting the tuning setting can comprise adjusting a setting of one or more tunable inductors of tunable filter 120, such as by applying a "baseline" tuning word that would assign an appropriate set of tuning settings to the tunable elements of tunable filter 120 if the tunable elements each achieved optimal performance levels. An adjusted signal level of antenna system 100 can then be measured in a second measuring step 303. By comparing the results of first tuning step 301 and second tuning step 303, a level change can be determined between the first signal level and the one or more adjusted signal levels in a determining step 304. This level change identified in determining step 304 can be compared against a predefined reference level change (e.g., known RTG response) in a comparing step 305. Furthermore, the method can be extended for two or more different tuning settings of antenna system 100. In this regard, determining a level change between the first signal level and one or more adjusted signal levels (e.g., a second signal level, a third signal level, etc.) can comprise determining an average level change between the first signal level and the one or more adjusted signal levels at the two or more different tuning settings.

Based on this differential comparison, a device setting of antenna system 100 can be adjusted in an adjusting step 306 to compensate for any difference identified in the comparing step 305 between the level change and the predefined reference level change. Adjusting a device setting of antenna system 100 can comprise adjusting a setting of one or more tunable capacitors of tunable filter 120. Alternatively, adjusting a device setting of antenna system 100 can comprise defining a tuning word table for antenna system 100 (e.g., at tuning controller 132) that is calibrated for the performance of the components comprised within. For example, the calibrated tuning word table can provide a single tuning word that defines all tuning settings for every tunable element of antenna system 100, or it can provide a sequence of tuning words that each define a subset of settings for one or more components of the system. In this way, the adjusted device setting can result in normal operation of antenna system 100 matching or more closely approximating a desired tuning response.

In one particular example, the methods discussed above can be performed during receive mode usage as shown in FIG. 1A. Specifically, first measuring step 301 can comprise measuring a receive (Rx) signal amplitude (e.g., RxLevel can identify Rx signal amplitude within about 1 dB resolution) of a signal received from an external source (e.g., a cell tower 200) with tunable filter 120 adjusted to a first tuning state. This first value for the Rx signal amplitude can be stored to memory. Tuning step 302 can comprise using tuning controller 132 to adjust one or more tunable elements of tunable filter 120 such that a second tuning state is selected. At this second tuning state, second measuring step 303 can comprise measuring a second value for the Rx signal amplitude, and this second value can be stored to memory.

The amplitude difference between the two values can be calculated in determining step 304, and this difference can be correlated with a known or expected response in comparing step 305. This data can be used to more accurately calibrate the tunable filter 120 in adjusting step 306. For example, tuning controller 132 can be provided with a number N of different look-up tables (e.g., 4 different look-up tables) corresponding to N different "bins" of device performance levels (e.g., 65%, 75%, 85%, and 95% of optimal performance). In this configuration, adjusting step 306 can comprise assigning a tuning word for tunable filter 120 that corresponds with the bin in which the device's performance is categorized. In this way, the "too good" parts may be "held back" in a sense, but the overall device tuning performance can be more precisely controlled. Alternatively, adjusting step 306 can comprise applying an algorithm that scales the baseline tuning word to achieve a performance level that matches or more closely approximates a desired tuning response. As noted above, measurement schemes that use more than two settings can be used to achieve even more accurate readings. It is also possible that the measurement signal can be generated inside the device and send out on a separate antenna such as a diversity antenna.

This receive-mode calibration can be performed at a final device test to help ensure consistent performance of every unit produced. Alternatively or in addition, such calibration can be performed at every phone boot using RxLevel. at reboot of the connected mobile platform, or at regular intervals in the field (e.g., at intervals defined by a specific signal or counter). Even if circumstances cause an erroneous determination of the proper tuning setting (e.g., fading, rebooting while in a fast car), the calibration procedure can be repeated (e.g., by rebooting the device) to determine a .correct tuning setting. In this way, the above method can be used not only to normalize the operation of antenna system 100, but it can also compensate for degradation of component performance as the device ages.

In another particular example, the disclosed methods can be adapted for execution using a transmit path as shown in FIG. 1B. In this alternative, antenna system 100 can be configured to generate a first transmission (Tx) signal with tunable filter 120 adjusted to a first tuning state (e.g., when antenna system 100 is in a DCS mode). First measuring step 301 can comprise measuring a first Tx signal level of this first Tx signal (e.g., at a network "sniffer" 220 in communication with a power meter or spectrum analyzer 222), and this first level can be stored to memory. Tuning step 302 can comprise adjusting tunable filter 120 such that a second tuning state is selected. At this second tuning state, a second Tx signal can be generated, and second measuring step 303 can comprise measuring a second Tx signal level of the second Tx signal and storing the second level to memory. Determining step 304 can comprise calculating an amplitude difference between the first and second levels, and comparing step 305 can comprise correlating this difference with a known response. Based on this comparison, adjusting step 306 can be performed to compensate for any deviation of the measured performance relative to the expected response.

In some configurations, calibrating the performance of antenna system 100 using Tx signals can require external measurement equipment (e.g., network "sniffer" 220 and power meter or spectrum analyzer 222), thereby generally limiting the method to being performed during a final device test after assembly. It can also be possible, however, that the measurement signal is measured inside the device on a separate antenna, such as a diversity antenna. Using an on-device receiver with a different antenna in this way, the method can be performed in the field. Alternatively, in-field use can also be accomplished by utilizing power measurements reported back from the network.

In yet a further particular example, the disclosed methods can be performed using the base station receive parameters on an uplink to determine antenna tuner performance. For example, measuring a first signal level can comprise measuring a first base station receive parameter at an uplink associated with antenna system 100 when antenna system 100 is set to a first tuning state. Likewise, measuring one or more adjusted signal levels can comprise measuring a second base station receive parameter at the uplink when antenna system 100 is set to a second tuning state.

Regardless of the particular implementation, the methods disclosed herein can be used once at the end of the manufacturing line as a factory calibration, at phone start (e.g., during a reboot process of antenna system 100) as part of the device initialization process, and/or at multiple other times during a lifetime of antenna system 100 (e.g., at regular intervals during phone use).

Figure 3B:
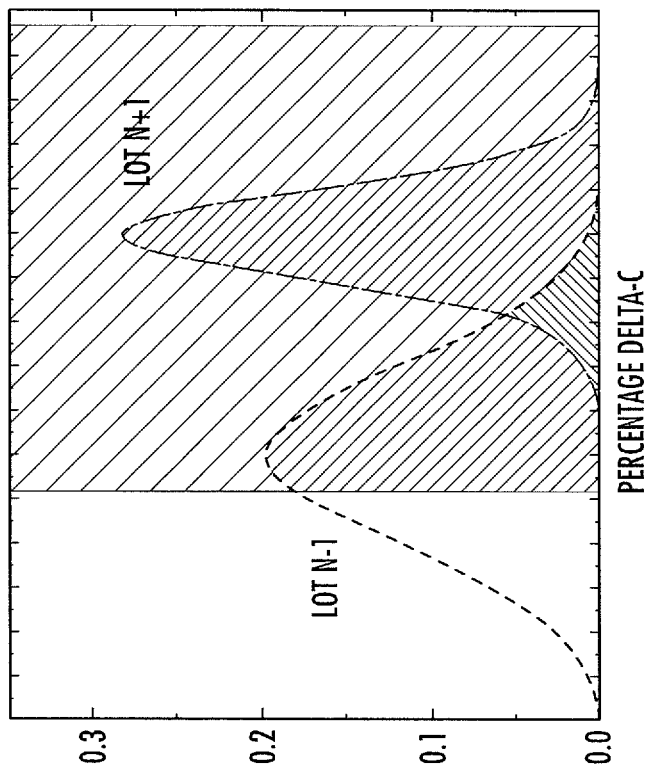
FIG. 3B is a graph showing selection criteria for tunable capacitors used in a tunable antenna system according to an embodiment of the presently disclosed subject matter.
Figure 3A:
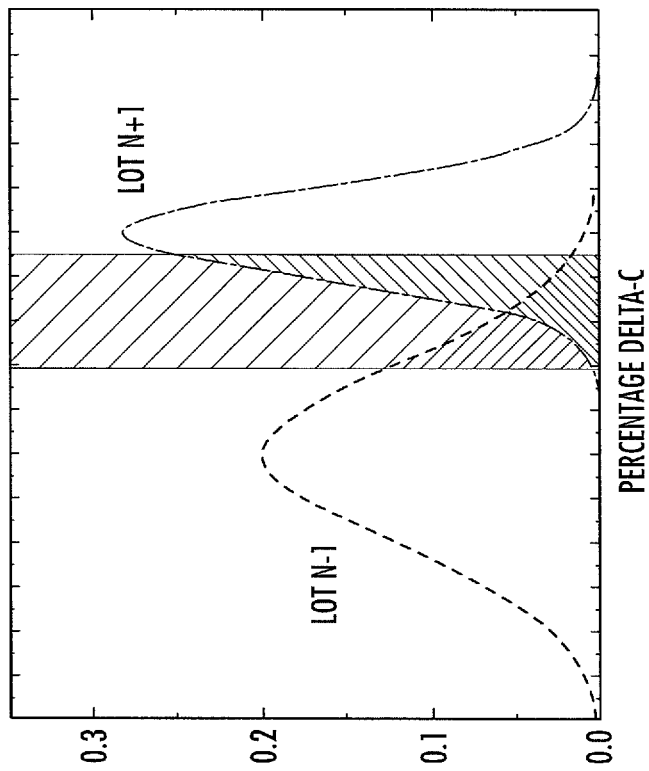
FIG. 3A is a graph showing selection criteria for tunable capacitors used in conventional tunable antenna systems.

In any configuration, the systems and methods disclosed herein can eliminate the need to bin devices at the time of manufacture, and as a result, the need for a NVRAM memory process add-on and/or for fuses or calibration in production can be avoided. Instead, the test specifications for individual components can be relaxed, with all parts over a given nominal performance level being considered good parts. Accordingly, production yield of such parts can be higher. For instance, whereas previous devices may require tight tolerances in the acceptable performance characteristics of the device components as shown in FIG. 3A, the systems and methods disclosed herein can adapt to device components having a widely varying range in their performance as shown in FIG. 3B. As a result, production yield management can be easier and can be targeted to maximize device performance. In this way, tuning words can be optimized for each phone, leading to better average phone performance while not throwing away parts that deviate too much from a desired performance level.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A method for calibrating antenna tuner device parameters comprising:
   measuring a first signal level of an antenna tuner device;
   adjusting a tuning setting of the antenna tuner device;
   measuring one or more adjusted signal levels of the antenna tuner device;
   determining a level change between the first signal level and the one or more adjusted signal levels;
   comparing the level change to a predefined reference level change; and
   adjusting a device setting of the antenna tuner device to compensate for a difference between the level change and the predefined reference level change.

2. The method of claim 1, wherein measuring a first signal level comprises measuring a first received signal level when the antenna tuner device is set to a first tuning state; and
   wherein measuring one or more adjusted signal levels comprises measuring a second received signal level when the antenna tuner device is set to a second tuning state.

3. The method of claim 2, comprising repeating steps of measuring a first signal level, adjusting a tuning setting, measuring one or more adjusted signal levels, determining a level change, comparing the level change to a predefined reference level change, and adjusting a device setting at multiple times during a lifetime of the antenna tuner device.

4. The method of claim 3, comprising repeating the steps during one of a reboot process of the antenna tuner device, a reboot of an associated mobile platform, or at periodic intervals.

5. The method of claim 4, wherein repeating the steps at periodic intervals comprises repeating the steps at intervals defined by a specific signal or counter.

6. The method of claim 1, wherein measuring a first signal level comprises measuring a first base station receive parameter at an uplink associated with the antenna tuner device when the antenna tuner device is set to a first tuning state; and
wherein measuring one or more adjusted signal levels comprises measuring a second base station receive parameter at the uplink when the antenna tuner device is set to a second tuning state.

7. The method of claim 1, wherein measuring a first signal level comprises measuring a first transmission signal level when the antenna tuner device is in a DCS mode; and
wherein measuring one or more adjusted signal levels comprises measuring a second transmission signal level when the antenna tuner device is set to a predetermined tuning state.

8. The method of claim 1, wherein adjusting a tuning setting comprises adjusting a setting of one or more tunable inductors of the antenna tuner device.

9. The method of claim 1, wherein adjusting a device setting of the antenna tuner device comprises adjusting a setting of one or more tunable capacitors of the antenna tuner device.

10. The method of claim 1, wherein adjusting a device setting of the antenna tuner device comprises defining a calibrated tuning word table for the antenna tuner device to be utilized in normal operation.

11. The method of claim 10, wherein the calibrated tuning word table is scaled from a baseline tuning word.

12. The method of claim 1, comprising adjusting a tuning setting of the antenna tuner device, measuring one or more adjusted signal levels of the antenna tuner device, and determining a level change between the first signal level and the one or more adjusted signal levels for two or more different tuning settings of the antenna tuner device.

13. The method of claim 12, wherein determining a level change between the first signal level and the one or more adjusted signal levels comprises determining an average level change between the first signal level and the one or more adjusted signal levels at the two or more different tuning settings.

14. A method for calibrating antenna tuner device parameters comprising:
measuring a first received signal level for an antenna tuner device set to a first tuning state;
adjusting a setting of one or more tunable inductors of the antenna tuner device;
measuring a second received signal level when the antenna tuner device is set to a second tuning state;
determining a level change between the first received signal level and the second received signal level;
comparing the level change to a predefined reference level change; and
adjusting a setting of one or more tunable capacitors of the antenna tuner device to compensate for a difference between the level change and the predefined reference level change.

15. A system for calibrating antenna tuner device parameters comprising:
an antenna;
a tunable filter connected to the antenna; and
a controller connected to the tunable filter, the controller being configured to measure a first signal level transmitted or received by the antenna, adjust a tuning setting of the tunable filter, measure one or more adjusted signal levels transmitted or received by the antenna, determine a level change between the first signal level and the one or more adjusted signal levels, compare the level change to a predefined reference level change, and adjust a device setting of the tunable filter to compensate for a difference between the level change and the predefined reference level change.

16. The system of claim 15, wherein the tunable filter comprises one or more tunable capacitors or inductors.

17. The system of claim 15, wherein the tunable filter comprises a tunable matching network.

18. The system of claim 15, wherein the controller is configured to adjust the device setting of the tunable filter by adjusting a setting of one or more tunable capacitors of the tunable filter.

19. The system of claim 15, wherein the controller is configured to adjust a device setting of the tunable filter by defining a calibrated tuning word table for the tunable filter to be utilized in normal operation.

20. The system of claim 19, wherein the calibrated tuning word table is scaled from a baseline tuning word.

* * * * *